(12) United States Patent
Lin et al.

(10) Patent No.: US 11,769,678 B2
(45) Date of Patent: Sep. 26, 2023

(54) LIQUID STORAGE FOR FACILITY CHEMICAL SUPPLY SYSTEM

(71) Applicant: TAIWAN SEMICONDUCTOR MANUFACTURING CO., LTD., Hsinchu (TW)

(72) Inventors: Tzu-Yang Lin, Tainan (TW); Cheng-Han Wu, Taichung (TW); Chen-Yu Liu, Kaohsiung (TW); Kuo-Shu Tseng, Banciao (TW); Shang-Sheng Li, Zhubei (TW); Chen Yi Hsu, Zhubei (TW); Yu-Cheng Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 214 days.

(21) Appl. No.: 17/100,218

(22) Filed: Nov. 20, 2020

(65) Prior Publication Data
US 2021/0202284 A1    Jul. 1, 2021

Related U.S. Application Data

(60) Provisional application No. 62/955,854, filed on Dec. 31, 2019.

(51) Int. Cl.
*H01L 21/67* (2006.01)

(52) U.S. Cl.
CPC .. *H01L 21/67242* (2013.01); *H01L 21/67023* (2013.01)

(58) Field of Classification Search
CPC ......... H01L 21/67242; H01L 21/67023; H01L 21/67225; B65D 88/54; B65D 90/0093; B65D 90/20; B65D 90/48
See application file for complete search history.

(56) References Cited

U.S. PATENT DOCUMENTS

| 2015/0346017 | A1* | 12/2015 | LePort | G01F 23/2921 |
| | | | | 73/152.24 |
| 2020/0165120 | A1* | 5/2020 | Wolfstaedter | B65B 65/003 |

FOREIGN PATENT DOCUMENTS

| CN | 104386386 A | * | 3/2015 | .............. B01D 29/27 |
| CN | 206269881 U | * | 6/2017 | .............. G01N 21/27 |
| CN | 108079623 A | * | 5/2018 | ......... B01D 21/0006 |
| CN | 107096250 B | * | 2/2019 | .............. B01D 15/08 |
| CN | 109813663 A | * | 5/2019 | .............. G01N 21/27 |
| EP | 1431424 A2 | * | 6/2004 | ........... C25D 17/001 |

* cited by examiner

*Primary Examiner* — Mohammed Shamsuzzaman
(74) *Attorney, Agent, or Firm* — McDermott Will & Emery LLP

(57) ABSTRACT

A lithography includes a storage tank that stores process chemical fluid, an anti-collision frame, and an integrated sensor assembly. The storage tank includes a dispensing port positioned at a lowest part of the storage tank in a gravity direction. The anti-collision frame is coupled to the storage tank. An integrated sensor assembly is disposed on at least one of the anti-collision frame and the storage tank to measure a variation in fluid quality in response to fluid quality measurement of fluid.

16 Claims, 11 Drawing Sheets

| Package type | capacity | material | Easy to clean | Number of connector | Feed in/out | Level judgment | Recycle cleanness | remain |
|---|---|---|---|---|---|---|---|---|
| Drum | 200L | PE/PTFE | Middle | 8 | Top/Top | Hard | Poor | 20~100L |
| IBC | 1000L | PE | Hard | 2 | Top/Top | Hard | Poor | 50~200L |
| embodiment | 800L | PE/PTFE | Easy | 3 | Top/Bottom | Easy | good | 0~5L |

FIG. 1

LIQUID STORAGE FOR FACILITY CHEMICAL SUPPLY SYSTEM

RELATED APPLICATION

This application claims priority to U.S. Provisional Patent Application No. 62/955,854 filed on Dec. 31, 2019, the entire contents of which are incorporated herein by reference.

BACKGROUND

In semiconductor applications, chemical reagents and compositions are required to be supplied in a high purity state, and specialized packaging or storage design has been developed to ensure that the supplied material is maintained in a pure and suitable form, throughout the package fill, storage, transport, and ultimate dispensing operations.

Maintaining a high purity is particularly important for the semiconductor applications, because any contaminants in the packaged material, and/or any ingress of environmental contaminants to the contained material in the package, may adversely affect the semiconductor device products that are manufactured with such liquids or liquid-containing compositions, rendering the semiconductor device products deficient or even useless for their intended use. As such, many types of high-purity packaging have been developed for liquids and liquid-containing compositions used in semiconductor device manufacturing, such as photoresists, etchants, chemical vapor deposition reagents, solvents, wafer and tool cleaning formulations, chemical mechanical polishing compositions (e.g., slurry), etc.

With respect to the high-purity packaging, conventional packaging such as containers or tanks have some issues. For example, liquid remains at the bottom of tanks and cannot be cleaned thoroughly, and an efficient cleaning process of the tank is difficult. Therefore, there is a growing need for the high-purity packaging that minimizes residual chemicals and maintain a pure and suitable form, throughout the package fill, storage, transport, and ultimate dispensing operations.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a properties of tanks in accordance with some embodiments of the present disclosure.

DETAILED DESCRIPTION

Figure 2:
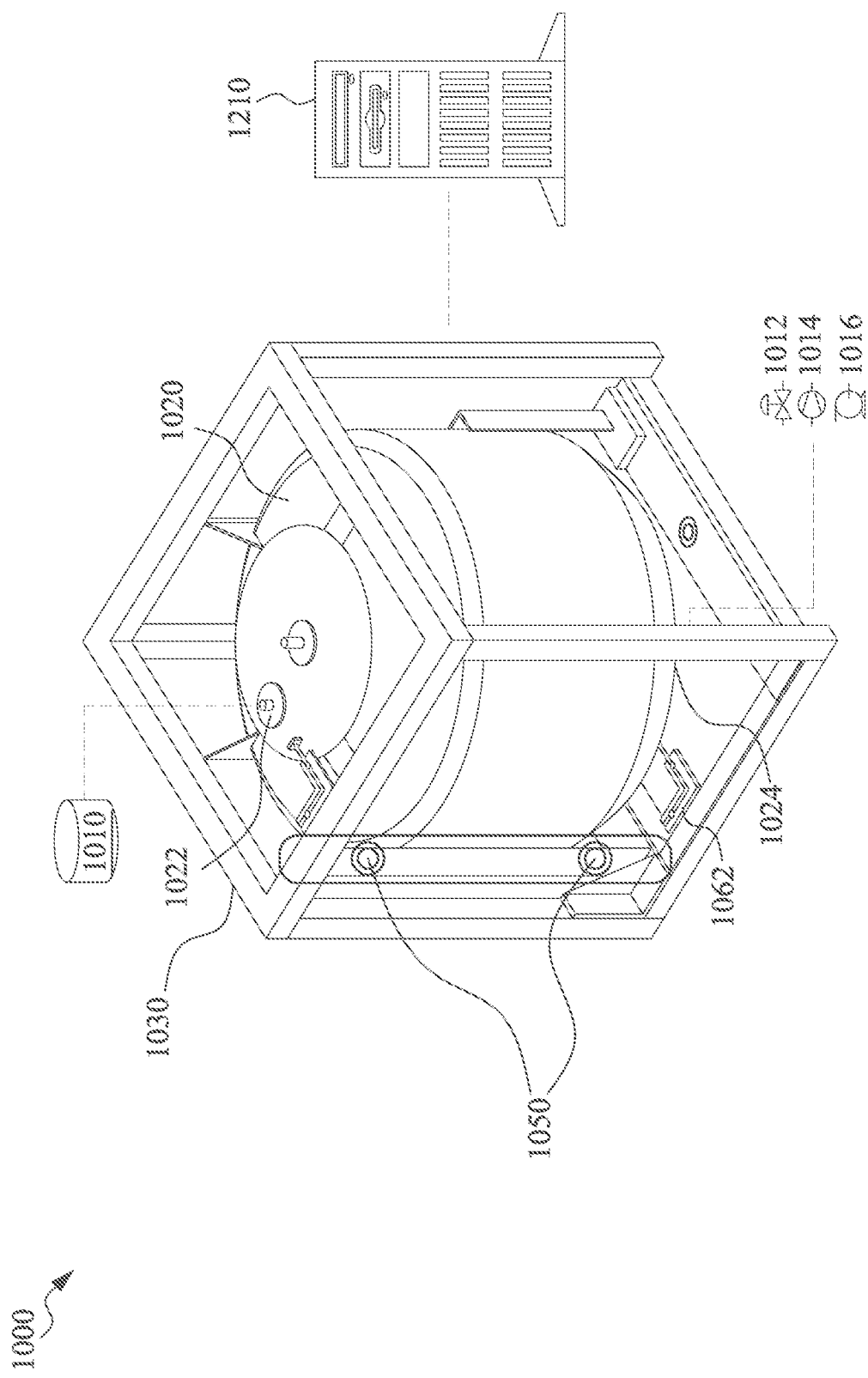
FIG. 2 shows a schematic view of an apparatus for an integrated storage tank system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Semiconductor processes, such as photolithography and wet etch and clean, have become more metal sensitive at advanced process nodes. In fluoropolymer delivery systems, metals leaching from material in components such as perfluoroalkoxy alkane (PFA) tubing, valves, and purifiers impact device yield. It can take months for metal contaminants to leach out of materials. Manufacturers are working to reduce contamination by researching ultraclean PFA materials, performing metals extraction testing on products, and optimizing processes to reduce contamination. Many invest in identifying where impurities may be introduced, and take corrective actions to prevent them.

Drum-shaped tanks and Intermediate Bulk Container (IBC) totes are commonly used in semiconductor processing applications. However, these types of tanks have some issues. For example, liquid remains at the bottom of tanks and cannot be used thoroughly, and an efficient cleaning process of the tank is difficult.

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

During a semiconductor manufacturing process, various types of liquid are used. The liquid used in the semiconductor manufacturing process includes, for example, water, aqueous solutions, acid (HF, buffered HF, HCl, $H_2SO_4$, etc), alkaline (KOH, TMAH, etc), photo resist, organic solvent (IPA, etc), $H_2O_2$, aqueous ammonia solution, and so on. By way of example and without limitation, propylene glycol methyl ether (PGME), propylene glycol methyl ether acetate (PGMEA), n-butyl acetate, isoamyl acetate, dimethyl sulfoxide, gamma-butyrolactone, 2-heptanol, and isobutyl propionate are also used in some embodiments.

FIG. 1 shows properties of tanks in accordance with some embodiments of the present disclosure. As shown in FIG. 1, the drum-shaped tanks store about 200 liters of liquid, the Intermediate Bulk Container (IBC) tote stores about 1,000 liters of liquid. Compared to the drum-shaped tank, the IBC tote is harder to clean. Both the drum-shaped tank and the IBC totes have feed inlets and outlets on the top side of them. It is difficult to determine the liquid level in both drum-shaped tanks and IBC totes, and recycling the tanks and totes are difficult because they are difficult to clean.

To remedy the remaining liquid volume problem, numerous designs of the containers have been proposed to facilitate emptying and refilling the tanks with liquid to reduce the remaining liquid volume within the storage tank.

Embodiments disclosed herein provide a liquid packaging to replace the traditional drum-shaped tank or the IBC tote. Liquid packaging embodiments of the present disclosure provide a liquid holding volume ranging from about 800 liters that are easier to clean and flush than drum-shaped tanks or IBC totes. The packaging according to the embodiments of the present disclosure is made of a polyethylene (PE), such as high-molecular weight polyethylene (HMWPE) or ultra-high molecular weight polyethylene (UHMWPE), or a fluoropolymer, such as polytetrafluoroethylene (PTFE), or has an inner wall coated with PE or PTFE. Embodiments of the packaging includes from about 1 to about 5 connectors located at top and bottom sides of the packaging in some embodiments. Embodiments of the packaging include an easy access to determine the liquid level, good recycle cleanness, and a remaining volume of the liquid ranging from about 0 to about 5 liters when the packaging is "empty.".

FIG. 2 schematically illustrates an integrated storage tank system 1000 constructed in accordance with an embodiment of the present disclosure. As shown in FIG. 2, the integrated storage tank system 1000 includes a storage tank 1020, an anti-collision frame 1030 securely holding the storage tank 1020, and an integrated sensor assembly 1050. The storage tank 1020 include liquid inlet ports 1022 and a liquid dispensing port 1024. The liquid inlet ports 1022 are configured to couple with a fluid supply container, and the liquid dispensing port 1024 is configured for coupling to a process tool. The integrated sensor assembly 1050 is disposed on or adjacent to the anti-collision frame 1030 and the storage tank 1020. The integrated storage tank system 1000 further includes a controller 1210 that is configured to communicate with the chemical supply system 1010 and the integrated sensor assembly 1050 for measuring the fluid stored in the storage tank 1020.

The liquid inlet ports 1022 and/or the liquid dispensing port 1024 are fluidly coupled to a fluid dispensing system that includes valves 1012, a pump 1014, and a compressor 1016 that are configured to deliver the fluid to a next process tool. In some embodiments, the fluid dispensing system is configured to control the pump by adjusting a speed of the pump to maintain the desired flow rate. In some embodiments, the fluid dispensing system is configured to control the pump by adjusting a speed of the pump to maintain the desired fluid pressure.

As shown in FIG. 2, in one embodiment of the present disclosure, the storage tank 1020 includes the liquid dispensing port 1024 positioned lower than the liquid inlet ports 1022 in the gravity direction. In some embodiments, the liquid dispensing port 1024 is positioned at a lowest part of the storage tank 1020. The shape of the liquid inlet ports 1022 is different from the shape of the liquid dispensing port 1024 in some embodiments. The size (e.g., diameter) of the liquid inlet ports 1022 is different from the size of the liquid dispensing port 1024 in some embodiments. In some embodiments, the size of the liquid inlet ports 1022 is larger than or smaller than the size of the liquid dispensing port 1024. The number of liquid inlet ports 1022 is the same as or different from the number of the liquid dispensing ports 1024 in some embodiments.

In a dispensing operation involving such a lower liquid dispensing port 1024, the liquid is dispensed from the liquid dispensing port 1024 by connecting a dispensing assembly 1062 to the liquid dispensing port 1024. After the dispensing assembly 1062 is coupled to the liquid dispensing port 1024, fluid pressure is applied on the liquid dispensing port 1024, so that it forces the liquid to flow through the dispensing assembly 1062 for discharge to associated flow circuitry to an end-use site. Alternatively, a negative pressure can be applied to the liquid dispensing port 1024 or to the dispensing assembly 1062 connected thereto, in order to draw the liquid out of the storage tank 1020. In some embodiments, the liquid dispensing port 1024 is used with the storage tank 1020 for draining purpose. In other embodiments, the liquid dispensing port 1024 is used with the storage tank 1020 for cleaning purpose.

Figure 3:
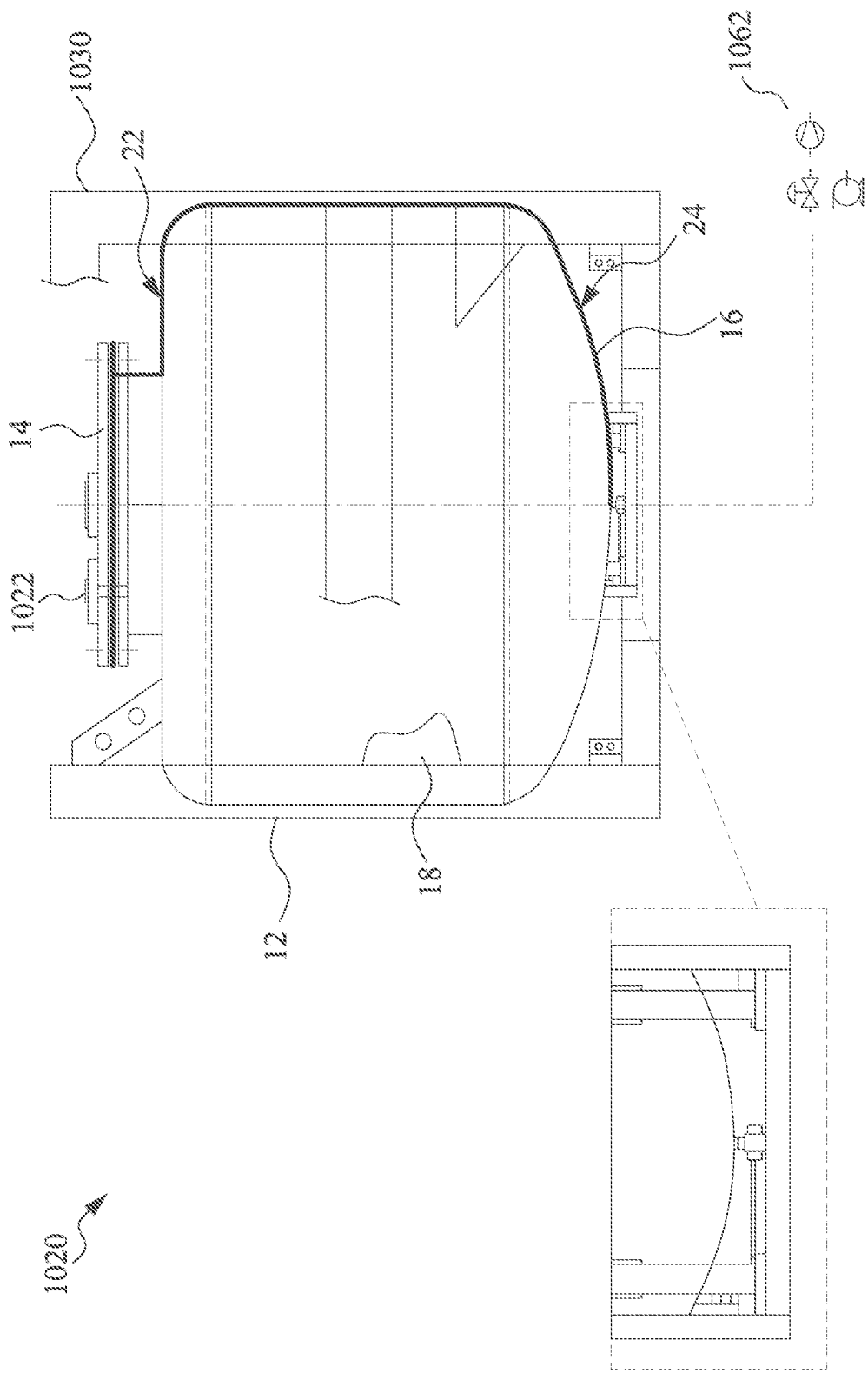
FIG. 3 shows a schematic view of a storage tank in accordance with some embodiments of the present disclosure.

FIG. 3 schematically illustrates a storage tank 1020 in accordance with an embodiment of the present disclosure. The storage tank 1020 includes a side wall 12, a first end 14, and a second end 16. As shown in FIG. 3, the first end 14 includes one or more liquid inlet ports 1022 disposed on the first end 14, and the second end 16 is generally opposed to the first end 14 of the storage tank 1020. The side wall 12 has a cylindrical shape and extends between the first end 14 and second end 16, such that the first end 14, second end 16, and side wall 12 generally define a storage tank exterior 18. The anti-collision frame 1030 is configured to securely fasten the storage tank 1020 based on the storage tank exterior 18. In some embodiments, a top profile 22 of the storage tank exterior 18 in the first end 14 is the same with a bottom profile 24 of the storage tank exterior 18 in the second end 16. In some embodiments, the top profile 22 of the storage tank exterior 18 in the first end 14 is different from the bottom profile 24 of the storage tank exterior 18 in the second end 16.

Figure 4:
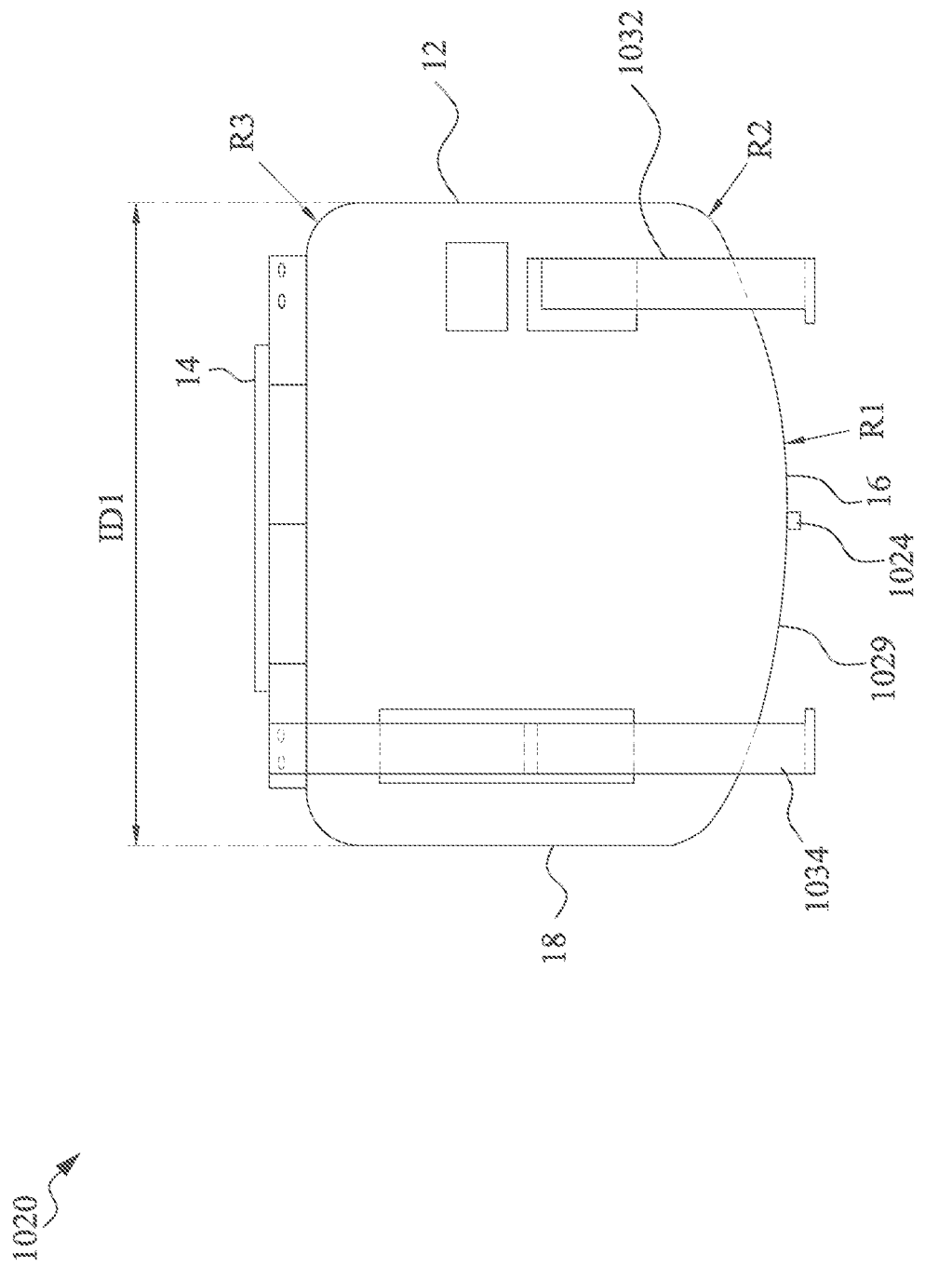
FIG. 4 shows a schematic view of another storage tank in accordance with some embodiments of the present disclosure.

FIG. 4 shows a schematic view of another storage tank in accordance with some embodiments of the present disclosure. As shown in FIG. 4, in some embodiments, the storage tank 1020 includes a frustoconical base 1029 in the second end 16 including a larger radius of curvature R1 near the dispensing port 1024 than the radius of curvature R2 near the side wall 12. The second end 16 of the storage tank 1020 has the radius of curvature R1 ranging from about 50 mm to about 2000 mm. In some embodiments, the radius of the curvature R2 ranges from about 50 mm to about 2000 mm among 50 mm, 100 mm, 200 mm, 500 mm, 1000 mm, 2000 mm inclusive of any combination of radius therebetween. In such an embodiment, the storage tank 1020 is configured to slow down the dispensing rate through the liquid dispensing port 1024 and to reduce the risk of electrostatic discharge around the storage tank 1020. The larger radius of curvature provides a more gradual slope to the tank bottom. Therefore, the flow along the tank bottom will be slower than if the radius of curvature had a steeper curve or grade.

The volume of the storage tank 1020 is in a range from about 100 liters to about 2000 liters, and can accommodate from about 1 to 10,000 liters of liquid in some embodiments. The volume of the storage tank 1020 is in a range from about 500 liters to about 1000 liters, or in a range from about 4 to 8,000 liters (e.g., 6,000 liters) in other embodiments. The corners are rounded in some embodiments (e.g. R2, R3). The bottom of storage tank exterior 18 of the storage tank 1020 has a corner having a radius of curvature R2 ranging from about 50 mm to about 2000 mm. In some embodiments, the radius of the curvature R2 ranges from about 50 mm to about 2000 mm among 1 mm, 2 mm, 5 mm, 10 mm, 20 mm, 50 mm, 100 mm, 200 mm, 500 mm, 1000 mm, 2000 mm inclusive of any combination of radius therebetween. The diameter of the storage tank 1020 is in a range from about 1000 mm to about 1500 mm and a height of the storage tank 1020 is in a range from about 1000 mm to about 1500 mm. In some embodiments, the storage tank 1020 has a cylindrical body portion and the frustoconical base 1029, which are smoothly connected with a rounded transition portion.

In some embodiments, the storage tank 1020 is made of one or more of a polyethylene (PE), a fluoropolymer, including a polytetrafluoroethylene (PTFE), and a stainless steel, including SS316L. In the SS316L stainless steel, the addition of 2% molybdenum provides greater resistance to acids and localized corrosion caused by chloride ions. Low-carbon stainless steels, such as 316L, have carbon contents below 0.03% and are used to avoid corrosion problems. When stainless steel or other metallic materials are used, the inner wall of the storage tank is coated with PE or PTFE in some embodiments.

In some embodiment, the storage tank 1020 includes an inner surface that is coated with a coating material, such as PE or PTFE, in some embodiments. In some embodiment, the storage tank 1020 further includes a liner (not shown) disposed in the storage tank having an interior volume. In such an embodiment, the liner is retained in a fixed position in the interior volume to maintain the high purity of the liquid medium. In some embodiments, the liner is made of PE or PTFE.

In some embodiments, the storage tank 1020 further includes a built-in dip tube 1032 immersed in the contained liquid and a return tube 1034. In some embodiments, the built-in dip tube 1032 is configured to allow visual inspection. In other embodiments, the built-in dip tube 1032 is configured to improve circulation and/or prevent chemical splash. The built-in dip tube 1032 and the return tube 1034 are made of a chemically inert material that can withstand corrosive chemicals. In certain embodiments, the built-in dip tube 1032 is made of stainless steel 316L EP to reduce maintenance costs and minimize spills across a wide range of temperatures and chemistries. In an alternative embodiments, the built-in dip tube 1032 is made of PFA or PTFE. In some embodiments, the storage tank 1020 may be connected with recirculation tanks, mixing or storage vessels and other storage tanks to meet semiconductor process needs.

Figure 5:
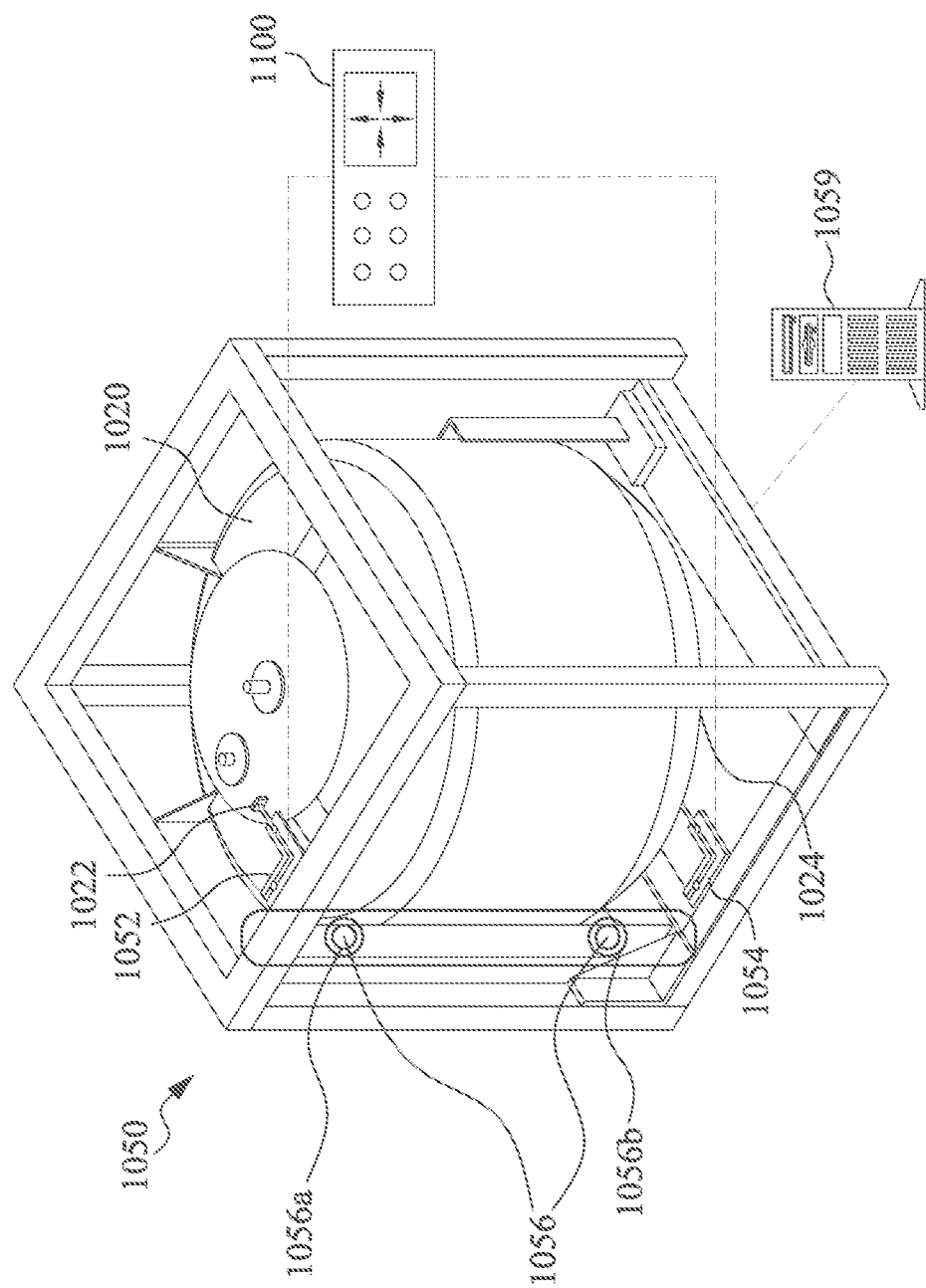
FIGS. 5 and 6 illustrate a schematic view of an exemplary integrated sensor assembly according to the present disclosure.
Figure 6:
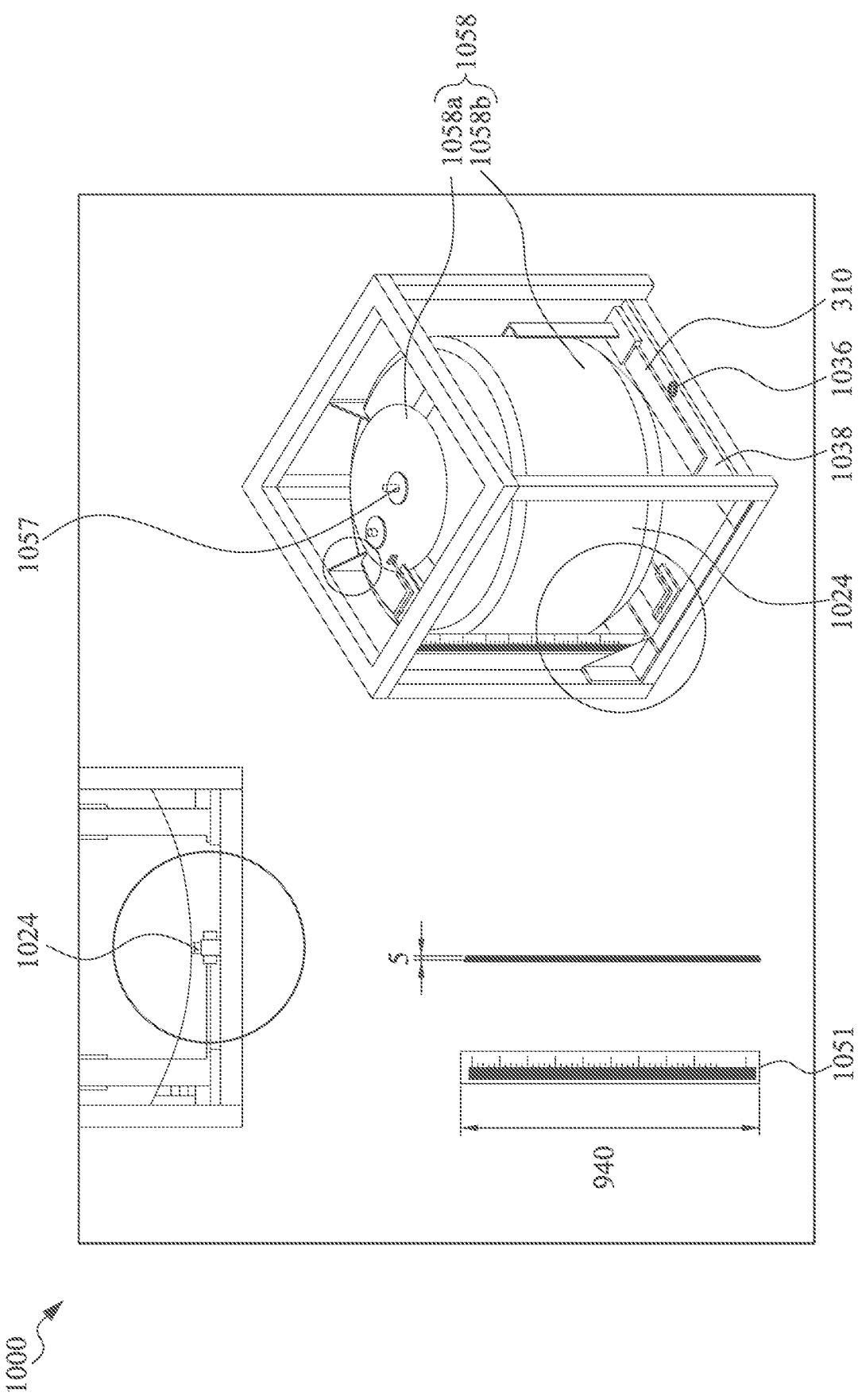

FIGS. 5 and 6 illustrate an exemplary integrated sensor assembly 1050 according to the present disclosure. In some embodiments, the integrated sensor assembly 1050 includes a liquid gauge 1051 (shown in FIG. 6) and analysis tubing 1052, 1054 removably mounted in the anti-collision frame 1030. The tubing provides a liquid pathway to and from the tank, so that liquid can flow into the integrated sensor assembly. As shown in FIG. 5, in some embodiments, an upstream analysis tubing 1052 is fluidly coupled to the liquid inlet ports 1022 and a downstream tubing 1054 is fluidly coupled to the liquid dispensing port 1024.

In some embodiments, the integrated sensor assembly 1050 includes a liquid level sensor 1056. In a certain embodiment, the liquid level sensor 1056 further includes a high liquid level sensor 1056*a* in the upper portion of the storage tank 1020 and a low liquid level sensor 1056*b* in the lower portion of the storage tank 1020. In some embodiments, the low liquid level sensor 1056*b* is operatively coupled with the liquid discharge valve, and are operatively coupled with the fluidic element controller 1059 to further modulate the liquid discharge valve, to avoid shortage of the liquid and to discharge from the storage tank 1020 for use in tracking liquid usage. The high liquid level sensor is configured to monitor the liquid level to prevent overfilling of the tank.

As shown in FIG. 6, in some embodiments, the anti-collision frame 1030 further includes a plurality of grounding connections 1036 and a static electricity detector 1038 configured to minimize the risk of the storage tank 1020 accumulating static charge therein. In some embodiments, the anti-collision frame 1030 is arranged such that the liquid dispensing port 1024 of the storage tank 1020 may not be opened unless the plurality of grounding connections 1036 are properly installed. This feature prevents danger when flammable liquids are stored in the storage tank 1020. In some embodiments, the anti-collision frame 1030 may be arranged such that the liquid dispensing port 1024 of the storage tank 1020 may not be opened unless a relative humidity is higher than a predefined threshold. In some embodiments, the static electricity detector 1038 are operatively coupled with the fluidic element controller 1059 and/or controller 1210 to further monitor, record and generate an alarm in connection with the static electricity adjacent to the liquid discharge valve for use in tracking liquid usage. In some embodiments, based on the alarm generated, the controller 1210 further sends a notification to a first external device associated with a fluidic element controller 1059 and a second external device associated with the next process tool.

In some embodiments, the integrated sensor assembly 1050 includes a temperature sensor 1058. As shown in FIG. 6, the temperature sensor 1058 further includes a first temperature sensor 1058*a* in the upper portion of the storage tank 1020 and a second temperature sensor 1058*b* in the lower portion of the storage tank 1020. In some embodiments, the second temperature sensor 1058*b* measures the temperature adjacent to the liquid discharge valve, and is operatively coupled with the fluidic element controller 1059 to further monitor, record and generate an alarm in connection with the temperature adjacent to the liquid discharge valve for use in tracking liquid usage. In some embodiments, based on the alarm generated, the controller 1210 further sends a notification to a first external device associated with a fluidic element controller 1059 and a second external device associated with the next process tool.

In some embodiments, the storage tank 1020 further includes quick-fitting connectors to ensure the appropriate connections prevent possible unsafe chemical mixing of fluids, for example, an incompatible new solvent and the old solvent. FIG. 6 shows schematic views of the storage tank 1020 with a quick-fitting mechanism 1057 according to various embodiments of the present disclosure. In some embodiments, a mating connector includes a quick-fitting portion to mate with the liquid inlet ports 1022 and to engage the quick-fitting portion with a mounting side of the liquid inlet ports 1022, thereby enabling quick, easy, and secure connection between the quick-fitting mechanism and the liquid inlet ports 1022. In some embodiments, the liquid inlet ports 1022 include an inclined portion of the quick-fitting portion that allows easy engagement with the liquid inlet ports 1022.

In some embodiments, the storage tank 1020 includes an ultrasonic liquid level sensor that may measure a distance between the ultrasonic liquid level sensor and a surface of the process liquid stored in the storage tank 1020. In some embodiments, when the storage tank 1020 is near empty, the ultrasonic liquid level sensor further sends a notification based on the liquid level information indicating that the storage tank 1020 is near empty. In some embodiments, based on the generating the notification, the feedback further sends the notification to a first external device associated with a fluidic element controller 1059 and a second external device associated with the next process tool.

In some embodiments, the anti-collision frame 1030 further includes a gate and a slot configured to receive the storage tank 1020 slidably therein. In some embodiments, the anti-collision frame 1030 may be arranged such that the gate of the anti-collision frame may not be fully shut unless the mating connector of the liquid inlet ports 1022 is properly installed. For example, the anti-collision frame 1030 may be arranged such that the gate of the anti-collision frame will not fully shut unless the storage tank 1020 is fully inserted into slot 310 (shown in FIG. 6) and/or mating connector associated with a the liquid inlet ports 1022 is properly installed in the anti-collision frame 1030.

Tanks of the present embodiments have much less liquid remaining inside the tank when the tank is "empty" than conventional drum-shaped tanks or IBC totes. Tanks of the present embodiments inhibit mixing of new solvent and old solvent. The tank of the present embodiments is easier to clean and more easily dispense liquid than the conventional tanks. In some embodiment, the storage tank 1020 further includes an agitator adjacent to the liquid dispensing port 1024, such that the liquid can be stirred by the agitator before the liquid is dispensed from the liquid dispensing port 1024. The agitator is operatively coupled with the fluidic element controller 1059 and/or controller 1210 (see FIG. 7) to further monitor, record and generate an alarm for use in tracking liquid usage. In some embodiments, the agitator is configured to monitor, record and generate an alarm for use in tracking liquid usage. In some embodiments, based on the alarm generated, the controller 1210 further sends a notification to a first external device associated with a fluidic element controller 1059 and a second external device associated with the next process tool.

When liquids are shipped in the container or tank, a gas space is generally maintained above the liquid, as a headspace gas, to accommodate thermal expansion and contraction of the liquid without excessive mechanical strain being placed on the storage tank. As the liquid is agitated during transport and other movement of the package, bubbles can become entrapped in the packaged liquid. If the liquid has high viscosity, such bubbles, particularly small ones, can remain in the liquid for a very long time. The use of such fluid analyzers is intended to monitor the purity of the liquid for its intended purpose.

Additionally, the presence of microbubbles in the liquid may be problematic from the standpoint of the presence of gas therein. The entrapped gas may interfere with subsequent processing of the liquid, or it may adversely affect a product manufactured with the liquid, and render it deficient or even useless for its intended purpose. Accordingly, elimination of bubble formation is important in relation to the accuracy and reliability of fluid determine for the material, as well as for efficient processing as well as manufacturing of end products using the liquid medium.

In some embodiments, the storage tank 1020 is a pressure vessel designed for pressurization to allow direct chemical dispensing from the storage tank without the need for pumps.

Figure 7:
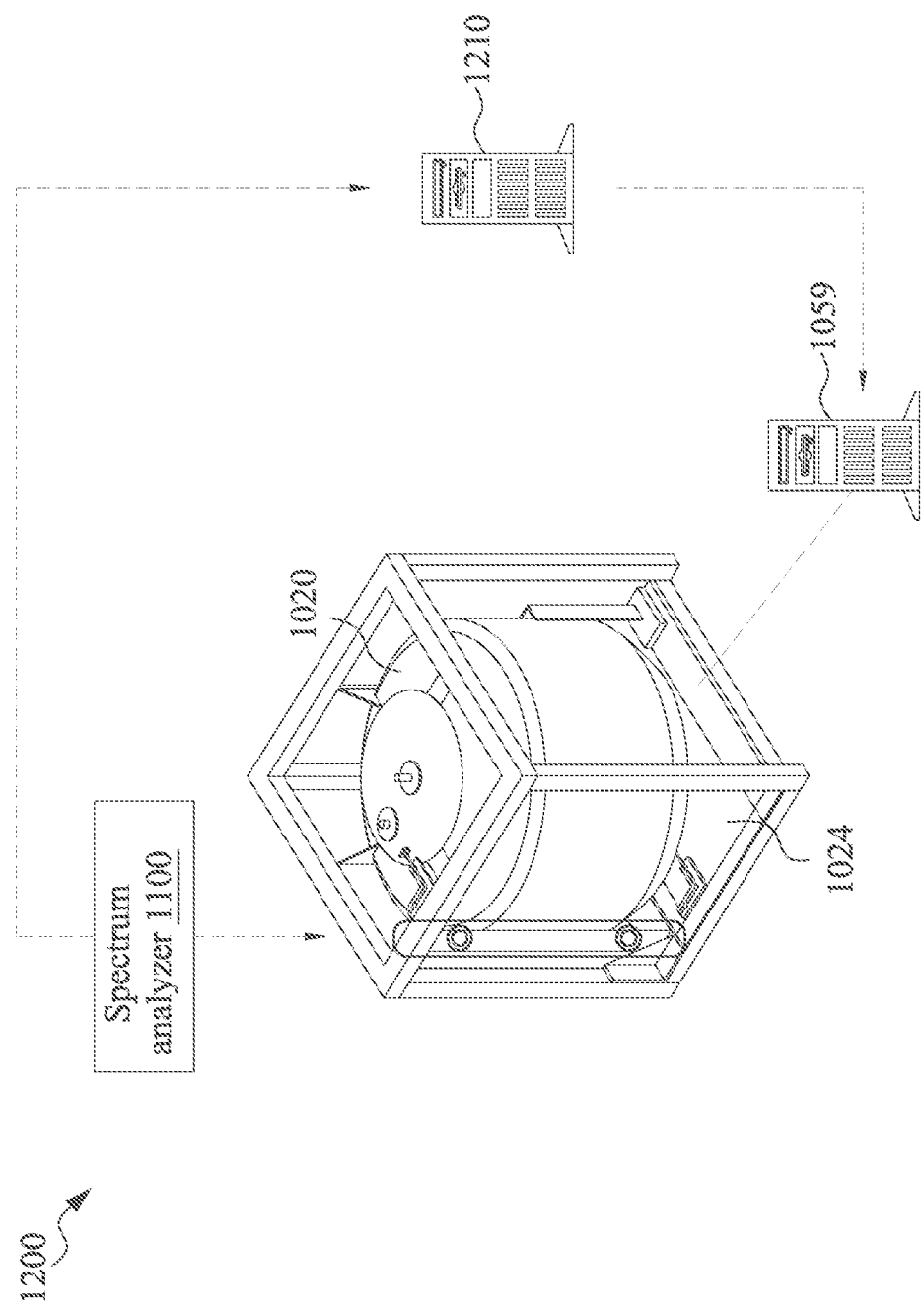
FIG. 7 shows a schematic of a feedback control system for controlling fluid according to some embodiments of the present disclosure.
Figure 8:
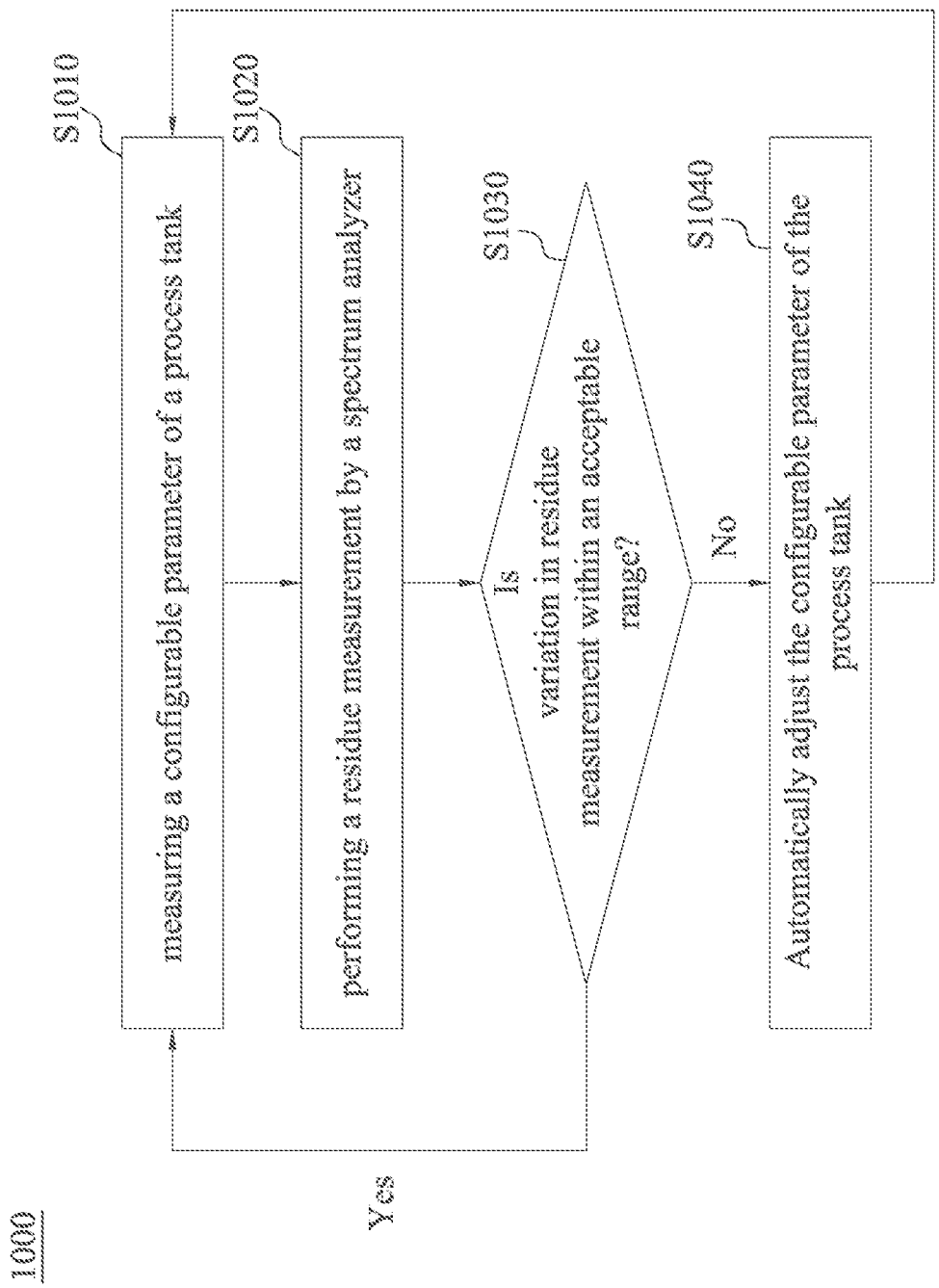
FIG. 8 shows a flow chart of a method of controlling a feedback control system of an semiconductor process chemical fluid according to an embodiment of the disclosure.

As shown in FIG. 7, in some embodiments, a feedback control system 1200 is provided for controlling chemical fluid quality based on a rate of change in fluid quality generated by a spectrum analyzer 1100. The spectrum analyzer is configured to monitor certain wavelengths of light, such as infrared (IR) or ultraviolet (UV), to detect the presence of certain chemical contaminants in the liquid. In some embodiments, the spectrum analyzer is an optical spectrometer configured to measure properties of light over a specific portion of the electromagnetic spectrum to identify materials. In such embodiments, the measured variable is the light's intensity but, in an alternative embodiment, is the polarization state. In some embodiments, the spectrum analyzer is a liquid chromatograph-mass spectrometer. In such embodiments, liquid chromatography separates mixtures with multiple components, and the mass spectrometer provides structural identity of the individual components with high molecular specificity and detection sensitivity.

The feedback control system 1200 monitors a rate of change in fluid quality indicated by the analysis from the spectrum analyzer 1100. In some embodiments, the analysis of the fluid quality is performed by the spectrum analyzer 1100 located adjacent to the storage tank 1020. In some embodiments, the spectrum analyzer 1100 is located away from the storage tank 1020. In some embodiments, an analysis for the fluid quality is performed at or adjacent to the liquid dispensing port 1024 to monitor the rate of change in the fluid quality. In some embodiments, the analysis of the fluid quality is performed on the next process tool. In some embodiments, the rate of change in the fluid quality is determined by the controller 1210 based on the analysis of the fluid quality by the spectrum analyzer 1100. The fluid quality measured by the spectrum analyzer 1100 indicates presence or absence of the fluid adjacent to the liquid dispensing port 1024 in some embodiments. In some embodiments, the fluid quality measured by the spectrum analyzer 1100 indicates the purity of the fluid adjacent to the liquid dispensing port 1024. In some embodiments, when changes in the fluid quality are detected by the spectrum analyzer 1100, the controller 1210 of the feedback control system 1200 performs a pre-determined process based on a value of the fluid quality and/or a changing rate of the fluid quality measured by the spectrum analyzer 1100.

In some embodiments, the spectrum analyzer 1100 includes a logic circuit programmed to generate a signal when the detected variation in analysis of the fluid quality is not within an acceptable range. For example, a signal is generated when the detected variation in the analysis of the fluid quality is above a certain threshold value. The threshold value of variation in analysis of the fluid quality is, for example, an expected minimum variation in the analysis of the fluid quality. In some embodiments, the expected minimum variation in the analysis of the fluid quality is determined based an average variation in analysis of the fluid quality for a largest change. In some embodiments, the expected minimum variation in the analysis of the fluid quality is, for example, one standard deviation or two standard deviations less than the average variation in the analysis of the fluid quality determined for the largest change.

In some embodiments, a variation in the fluid quality measured by the spectrum analyzer 1100 is used as a feedback for adjusting a time delay between a subsequent supply and dispensing of the liquid. In some embodiments, a fluidic element controller 1059 is located adjacent to the anti-collision frame 1030. In some embodiments, a fluidic element controller 1059 is located away from the anti-collision frame 1030. The fluidic element controller 1059 controls a plurality of fluidic elements such as a control valve, a pump, and a compressor. The signal from the fluidic element controller 1059 is used as a feedback for adjusting the time delay between subsequent process chemical fluid supply and dispensing in some embodiments. In some embodiments, the feedback may be connected with an actuator to control one of the fluidic elements.

The feedback control system provided in some embodiments further send a notification based on a subsequent quality analysis information indicating the quality analysis is within the acceptable quality analysis range. In some embodiments, the notification includes a spectrum difference between the process chemical fluid supply and the dispensing. In some embodiments, based on the generating the notification, the feedback further sends the notification to a first external device associated with a fluidic element controller 1059 and a second external device associated with the next process tool.

Figure 9:
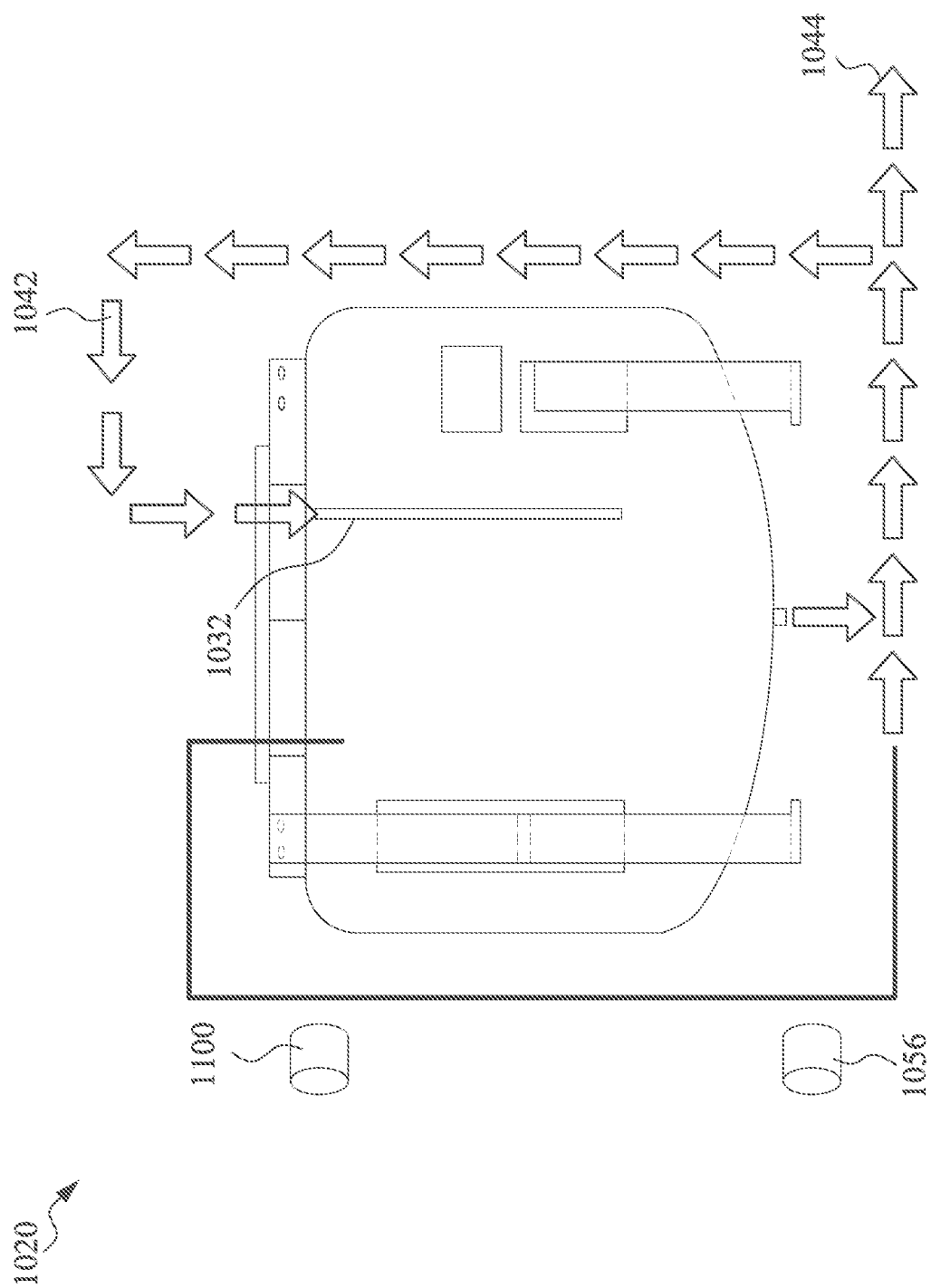
FIG. 9 illustrates a method of cleaning the storage tank according to an embodiment of the disclosure.

FIG. 9 illustrates a method of cleaning the storage tank 1020 according to an embodiment of the disclosure. First, a liquid level of the chemical fluid is checked using the liquid level sensor 1056. A quality of the chemical fluid is then checked using the spectrum analyzer 1100. In a following step, the chemical fluid is circulated along a circulation line 1042. The chemical fluid is then flushed to a flush line 1044. Finally, chemical fluid is filled in the storage tank 1020.

Figure 10A:
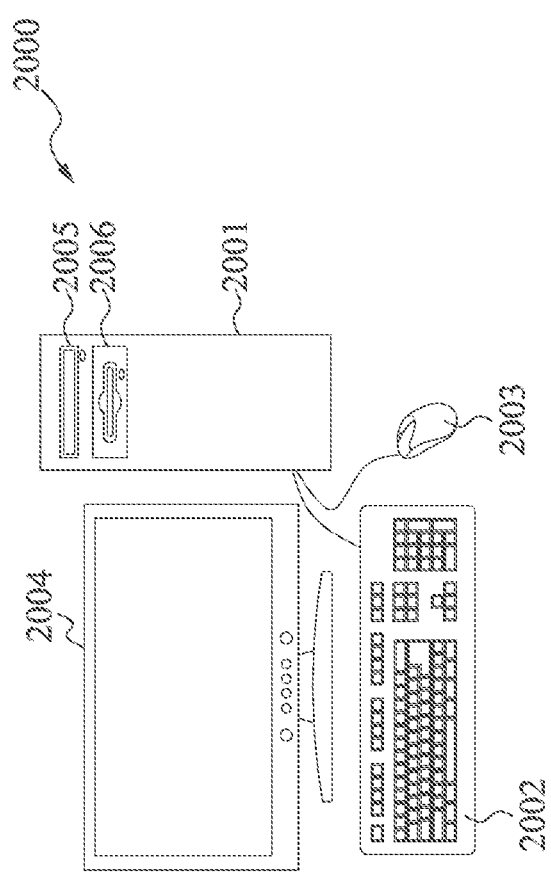
FIGS. 10A and 10B illustrate a configuration of the controller in accordance with some embodiments of the disclosure.
Figure 10B:
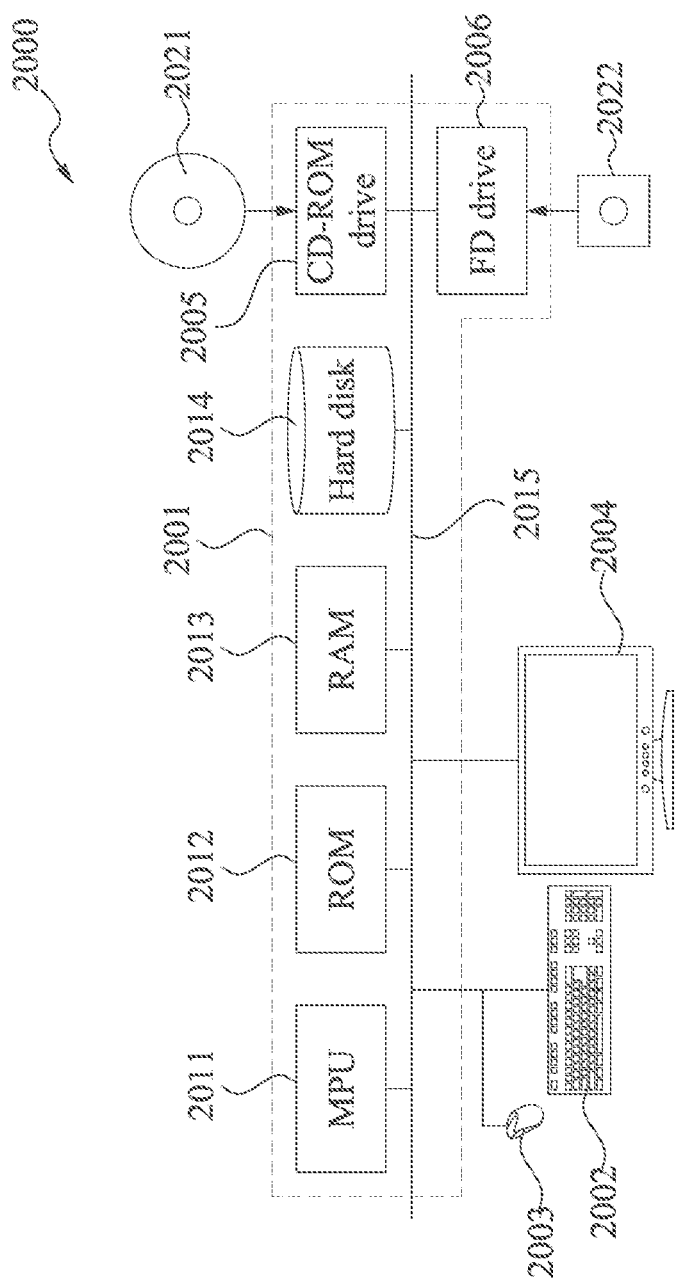

FIGS. 10A and 10B illustrate a configuration of the controller 1210 in accordance with some embodiments of the disclosure. In some embodiments, a computer system 2000 is used as the controller 1210. In some embodiments, the computer system 2000 performs the functions of the controller as set forth above.

FIG. 10A is a schematic view of a computer system. All of or a part of the processes, method and/or operations of the foregoing embodiments can be realized using computer hardware and computer programs executed thereon. In FIG. 10A, a computer system 2000 is provided with a computer 2001 including an optical disk read only memory (e.g., CD-ROM or DVD-ROM) drive 2005 and a magnetic disk drive 2006, a keyboard 2002, a mouse 2003, and a monitor 2004.

FIG. 10B is a diagram showing an internal configuration of the computer system 2000. In FIG. 10B, the computer 2001 is provided with, in addition to the optical disk drive 2005 and the magnetic disk drive 2006, one or more processors, such as a micro processing unit (MPU) 2011, a ROM 2012 in which a program such as a boot up program is stored, a random access memory (RAM) 2013 that is connected to the MPU 2011 and in which a command of an application program is temporarily stored and a temporary storage area is provided, a hard disk 2014 in which an application program, a system program, and data are stored, and a bus 2015 that connects the MPU 2011, the ROM 2012, and the like. Note that the computer 2001 may include a network card (not shown) for providing a connection to a LAN.

The program for causing the computer system 2000 to execute the functions of an apparatus for controlling the apparatus in the foregoing embodiments may be stored in an optical disk 2021 or a magnetic disk 2022, which are inserted into the optical disk drive 2005 or the magnetic disk drive 2006, and transmitted to the hard disk 2014. Alternatively, the program may be transmitted via a network (not shown) to the computer 2001 and stored in the hard disk 2014. At the time of execution, the program is loaded into the RAM 2013. The program may be loaded from the optical disk 2021 or the magnetic disk 2022, or directly from a network. The program does not necessarily have to include, for example, an operating system (OS) or a third party program to cause the computer 2001 to execute the functions of the controller 1210 in the foregoing embodiments. The program may only include a command portion to call an appropriate function (module) in a controlled mode and obtain desired results.

The integrated storage tank system and the feedback control system for controlling chemical fluid quality in accordance with embodiments of the present disclosure provide a high-purity packaging that minimizes residual chemicals, and maintains a pure and suitable form, throughout the package fill, storage, transport, and ultimate dispensing operations.

An embodiment of the disclosure is a liquid supply system that includes a storage tank, an anti-collision frame, and an integrated sensor assembly. The storage tank stores a process chemical fluid and includes a dispensing port that is positioned at a lowest part of the storage tank in a gravity direction. The anti-collision frame is coupled to the storage tank. The integrated sensor assembly is disposed on at least one of the anti-collision frame and the storage tank to measure a variation in fluid quality in response to a fluid quality measurement of fluid. In some embodiments, the storage tank includes a frustoconical base. In some embodiments, the liquid supply system further comprises a feedback controller coupled to the integrated sensor assembly and one or more adjustable fluidic elements controlling supply and dispense of the process chemical fluid associated with the liquid supply system. In some embodiments, the feedback controller is configured to adjust one or more parameters of the process chemical fluid and the adjustable fluidic element based on a variation in output of the integrated sensor assembly generated by the fluid. In some embodiments, the feedback controller is configured to determine whether a variation in fluid quality measurement of the fluid is within an acceptable range. In some embodiments, in response to the variation in fluid quality measurement that is not within the acceptable range, the feedback controller automatically adjusts a configurable parameter of the fluid stored in a storage tank. In some embodiments, the feedback controller sends a notification based on a fluid quality measurement information when a rate of change in fluid quality generated by a spectrum analyzer is greater than a threshold.

Another embodiment of the disclosure is a liquid supply system that includes a storage tank, an anti-collision frame, an integrated sensor assembly and a feedback controller. The storage tank stores process chemical fluid, and includes a liquid dispensing port positioned at a lowest part of the storage tank in a gravity direction. The anti-collision frame is coupled to the storage tank. The integrated sensor assembly is disposed on at least one of the anti-collision frame and the storage tank. The feedback controller is coupled to the integrated sensor assembly and one or more of a process supply source, and fluidic control elements controlling supply and dispense of the process chemical fluid associated with the liquid supply system. The feedback controller is configured to adjust one or more parameters of the process chemical fluid and the fluidic control elements controlling the supply and the dispense of the process chemical fluid in response to a measurement result of the integrated sensor assembly. In some embodiments, the storage tank includes a frustoconical base. In some embodiments, the storage tank includes a larger radius of curvature near the dispensing port than a radius of curvature near a side wall. In some embodiments, the storage tank has same top and bottom exterior profiles. In some embodiments, the storage tank has different top and bottom exterior profiles. In some embodiments, the fluidic control elements are liquid discharge valves. In some embodiments, the storage tank includes a plurality of grounding connections and a static electricity detector.

Yet another embodiment of the disclosure is a method of controlling a feedback control system of a semiconductor process chemical fluid. The method includes measuring a configurable parameter of the semiconductor process chemical fluid stored in a storage tank. Then, a fluid quality measurement of fluid is performed by a spectrum analyzer. Subsequently, a variation in fluid quality measurement of the fluid is determined whether the variation is within an acceptable range. In response to a variation in fluid quality measurement that is not within the acceptable range of variation in fluid quality measurement, the configurable parameter of the semiconductor process chemical fluid is automatically adjusted to set the variation in fluid quality measurement of the fluid within the acceptable range. In some embodiments, the feedback control system further generate a notification based on a new fluid quality measurement information indicating the fluid quality measurement is within the acceptable fluid quality measurement range. In some embodiments, the feedback control system further send a notification to a first external device associated with a fluidic element controller and a second external device associated with a next process tool. In some embodiments, after measuring a configurable parameter of the semiconductor process chemical fluid stored in a storage tank, the feedback control system further measure static electricity measured by a static electricity detector adjacent to a liquid discharge valve. In some embodiments, the feedback control system further adjust time delay between subsequent process chemical fluid supply and dispensing of the fluid. In some embodiments, the feedback control system further send the notification to a first external device associated with an adjustable fluidic element controller and a second external device associated with a liquid supply system.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A liquid supply system, comprising:
a storage tank for storing a process chemical fluid, the storage tank including a dispensing port positioned at a lowest part of the storage tank in a gravity direction;
an anti-collision frame coupled to the storage tank; and
a spectrum analyzer located adjacent to the dispensing port of the storage tank to measure a variation in fluid quality in response to a fluid quality measurement of fluid, wherein a time delay between subsequent process chemical fluid supply and dispensing of the fluid is adjusted based on the variation in fluid quality measured by the spectrum analyzer;
a feedback controller coupled to the spectrum analyzer and one or more valves controlling supply and dispense of the process chemical fluid associated with the liquid supply system;
wherein the feedback controller is configured to adjust one or more parameters of the process chemical fluid and the valves based on a variation in output of the spectrum analyzer generated by the fluid.

2. The liquid supply system of claim 1, wherein the storage tank includes a frustoconical base.

3. The liquid supply system of claim 1, wherein the feedback controller is configured to determine whether the variation in fluid quality is within an acceptable range.

4. The liquid supply system of claim 1, wherein the feedback controller, in response to the variation in fluid quality that is not within the acceptable range, automatically adjusts a configurable parameter of the fluid stored in the storage tank.

5. The liquid supply system of claim 1, wherein the feedback controller sends a notification based on a fluid quality measurement information when a rate of change in fluid quality generated by the spectrum analyzer is greater than a threshold.

6. A liquid supply system, comprising:
a storage tank storing process chemical fluid, the storage tank including a liquid dispensing port positioned at a lowest part of the storage tank in a gravity direction;
an anti-collision frame coupled to the storage tank;
a spectrum analyzer located adjacent to the liquid dispensing port of the storage tank to measure a variation in fluid quality; and
a feedback controller coupled to the spectrum analyzer and one or more of a process supply source, and fluidic control elements controlling supply and dispense of the process chemical fluid associated with the liquid supply system,
wherein the feedback controller is configured to adjust a time delay between subsequent process chemical fluid supply and dispensing of the fluid based on the variation in fluid quality measured by the spectrum analyzer;
wherein the feedback controller is configured to adjust one or more parameters of the process chemical fluid and the fluidic control elements based on a variation in output of the spectrum analyzer generated by the process chemical fluid.

7. The liquid supply system of claim 6, wherein the storage tank includes a frustoconical base.

8. The liquid supply system of claim 6, wherein the storage tank includes a larger radius of curvature near the dispensing port than a radius of curvature near a side wall.

9. The liquid supply system of claim 6, wherein the storage tank has same top and bottom exterior profiles.

10. The liquid supply system of claim 6, wherein the storage tank has different top and bottom exterior profiles.

11. The liquid supply system of claim 6, wherein the fluidic control elements are liquid discharge valves.

12. The liquid supply system of claim 9, wherein the storage tank includes a plurality of grounding connections and a static electricity detector.

13. A feedback control system of a liquid supply system, the liquid supply system including a storage tank for storing a process chemical fluid, the feedback control system comprising:
   a spectrum analyzer located adjacent to a dispensing port of the storage tank to measure a variation in fluid quality in response to a fluid quality measurement of fluid; and
   a feedback controller coupled to the spectrum analyzer and an adjustable fluidic element controlling supply and dispense of the process chemical fluid, wherein the feedback controller is configured to adjust a time delay between subsequent process chemical fluid supply and dispensing of the fluid based on the variation in fluid quality measured by the spectrum analyzer;
   wherein the liquid supply system further comprises an anti-collision frame coupled to the storage tank, and wherein the spectrum analyzer is disposed on the anti-collision frame to measure the variation in fluid quality in response to the fluid quality measurement of fluid;
   wherein the feedback controller is configured to adjust one or more parameters of the process chemical fluid and the adjustable fluidic element based on a variation in output of the spectrum analyzer generated by the fluid.

14. The feedback control system of claim 13, wherein the storage tank includes a dispensing port positioned at a lowest part of the storage tank in a gravity direction.

15. The feedback control system of claim 13, wherein the feedback controller is configured to determine whether the variation in fluid quality is within an acceptable range.

16. The feedback control system of claim 15, wherein the feedback controller, in response to the variation in fluid quality that is not within the acceptable range, automatically adjusts a configurable parameter of the fluid stored in the storage tank.

* * * * *